(12) United States Patent
Keysar et al.

(10) Patent No.: US 9,379,265 B2
(45) Date of Patent: Jun. 28, 2016

(54) INTEGRATED CIRCUIT COMBINATION OF A TARGET INTEGRATED CIRCUIT, PHOTOVOLTAIC CELLS AND LIGHT SENSITIVE DIODES CONNECTED TO ENABLE A SELF-SUFFICIENT LIGHT DETECTOR DEVICE

(71) Applicant: SOL CHIP LTD., Haifa (IL)

(72) Inventors: Shani Keysar, Haifa (IL); Doron Pardess, D.N. Misgav (IL); Rami Friedlander, Zichron Yaakov (IL)

(73) Assignee: Sol Chip Ltd., Haifa (IL)

( * ) Notice: Subject to any disclaimer, the term of this patent is extended or adjusted under 35 U.S.C. 154(b) by 0 days.

(21) Appl. No.: 14/062,070

(22) Filed: Oct. 24, 2013

(65) Prior Publication Data

US 2014/0048900 A1    Feb. 20, 2014

Related U.S. Application Data

(63) Continuation-in-part of application No. 13/270,869, filed on Oct. 11, 2011, now Pat. No. 8,952,473, and a (Continued)

(51) Int. Cl.
*H01L 27/146* (2006.01)
*H01L 31/05* (2014.01)
(Continued)

(52) U.S. Cl.
CPC .............. *H01L 31/05* (2013.01); *H01L 25/167* (2013.01); *H01L 31/02008* (2013.01); *H01L 31/02167* (2013.01); *H01L 31/03921* (2013.01); *H01L 2924/0002* (2013.01); *Y02E 10/50* (2013.01)

(58) Field of Classification Search
CPC ............ H01L 31/02021; H01L 31/042; H01L 31/0522; H01L 27/142; H01L 31/0232; H01L 31/048; H01L 31/0521; H01L 31/058; H01L 31/0524; H01L 31/0547; H01L 31/18; H01L 21/02532; H01L 2224/32225; H01L 23/481; H01L 23/58; H01L 31/02; H01L 31/02005; H01L 31/0203; H01L 31/044
USPC .......................... 257/443, 444, 433, 446, 431
See application file for complete search history.

(56) References Cited

U.S. PATENT DOCUMENTS

| 4,784,701 A | 11/1988 | Sakai et al. |
| 5,155,565 A | 10/1992 | Wenz et al. |

(Continued)

FOREIGN PATENT DOCUMENTS

| JP | 9312349 | 12/1997 |
| WO | WO 03/079438 | 9/2003 |

OTHER PUBLICATIONS

International Search Authority: International Search Report for the corresponding International Patent Application PCT/IL2009/000930; Date of Completion: Feb. 10, 2010.

(Continued)

*Primary Examiner* — Duy T Nguyen
(74) *Attorney, Agent, or Firm* — M&B IP Analysts, LLC

(57) ABSTRACT

An integrated circuit (IC) comprises a plurality of photovoltaic (PV) cells formed over a passivation layer of a target integrated circuit (TIC), wherein at least one PV cell of the plurality of PV cells is usable as a light sensing device; an interface to an energy storage unit; the TIC comprising at least: a control unit; and a switching circuit, the switching circuit coupled to the plurality of PV cells, the energy storage, and the control unit; wherein the control unit is configured to control at least the switching circuit to configure a connection scheme, wherein the connection scheme devises at least one first PV cell of the plurality of PV cells to connect to the energy storage and at least one second PV cell to connect to the control unit for light detection.

11 Claims, 10 Drawing Sheets

Related U.S. Application Data continuation-in-part of application No. 13/053,610, filed on Mar. 22, 2011, now Pat. No. 8,957,488, which is a continuation of application No. PCT/IL2009/000930, filed on Sep. 29, 2009.

(60) Provisional application No. 61/787,017, filed on Mar. 15, 2013, provisional application No. 61/391,905, filed on Oct. 11, 2010, provisional application No. 61/100,770, filed on Sep. 29, 2008.

(51) Int. Cl.
| | |
|---|---|
| *H01L 25/16* | (2006.01) |
| *H01L 31/0392* | (2006.01) |
| *H01L 31/02* | (2006.01) |
| *H01L 31/0216* | (2014.01) |

(56) References Cited

U.S. PATENT DOCUMENTS

| | | | |
|---|---|---|---|
| 5,527,716 A | 6/1996 | Kusian et al. | |
| 5,998,808 A | 12/1999 | Matsushita | |
| 6,313,396 B1* | 11/2001 | Glenn | 136/244 |
| 6,680,468 B1 | 1/2004 | Wang | |
| 7,098,394 B2 | 8/2006 | Armer et al. | |
| 7,196,391 B2 | 3/2007 | Hsieh | |
| 7,675,158 B2 | 3/2010 | Kim et al. | |
| 2002/0170591 A1 | 11/2002 | Armer et al. | |
| 2002/0195136 A1 | 12/2002 | Takabayashi et al. | |
| 2004/0102022 A1 | 5/2004 | Jiang et al. | |
| 2004/0185667 A1 | 9/2004 | Jenson | |
| 2004/0264225 A1* | 12/2004 | Bhavaraju et al. | 363/120 |
| 2005/0104747 A1* | 5/2005 | Silic et al. | 340/944 |
| 2005/0105224 A1 | 5/2005 | Nishi | |
| 2005/0145274 A1 | 7/2005 | Polce et al. | |
| 2006/0284302 A1 | 12/2006 | Kim et al. | |
| 2007/0079866 A1 | 4/2007 | Borden et al. | |
| 2007/0087230 A1 | 4/2007 | Jenson et al. | |
| 2008/0245400 A1 | 10/2008 | Li | |
| 2008/0306700 A1* | 12/2008 | Kawam | H01L 31/02021 702/64 |
| 2008/0314432 A1 | 12/2008 | Paulson et al. | |
| 2009/0014049 A1 | 1/2009 | Gur et al. | |
| 2009/0217965 A1 | 9/2009 | Dougal et al. | |
| 2009/0288700 A1 | 11/2009 | Lifka et al. | |
| 2010/0018565 A1 | 1/2010 | Funakoshi | |
| 2010/0029074 A1 | 2/2010 | MacKay et al. | |
| 2010/0126556 A1* | 5/2010 | Benitez et al. | 136/246 |
| 2010/0148293 A1 | 6/2010 | Jain et al. | |
| 2010/0186804 A1 | 7/2010 | Cornfeld | |
| 2011/0067327 A1* | 3/2011 | Eiffert et al. | 52/173.3 |
| 2011/0109259 A1* | 5/2011 | Choi | H04M 1/0262 320/101 |
| 2011/0312286 A1* | 12/2011 | Lin et al. | 455/73 |
| 2012/0062036 A1* | 3/2012 | Rabinovici | H01L 31/02021 307/77 |

OTHER PUBLICATIONS

International Search Authority: International Preliminary Report on Patentability (Chapter I of the Patent Cooperation Treaty) including "Written Opinion of the International Searching Authority" (PCT Rule 43bis. 1) for the corresponding International Patent Application No. PCT/IL2009/000930; Date of Issuance: Mar. 29, 2011.

ROHM Semiconductor, "Ambient Light Sensor ICs for automatic light control processing: Selection Guide"; ROHM Marketing, USA; accessed online Mar. 27, 2009 at www.rohmsemiconductor.com; San Diego, CA.

TAOS (Texas Advanced Optoelectronic Solutions), "TSL2550 Ambient Light Sensor With SMBus Interface"; TAOS029A—Dec. 2003; accessed online Jan. 1, 2004 at www.taosinc.com; Plano, TX.

CUNY CAT, "Technology Opportunity: Enhanced Performance Photodector"; The CUNY Center for Advanced Technology in Photonics Applications (CUNY CAT); accessed Oct. 28, 2010 at www.cunycat.org; New York, NY.

Gunchul Shin et al., "Micromechanics and Advanced Designs for Curved Photodetector Arrays in Hemispherical Electronic-Eye Cameras"; small 2010, vol. 6, No. 7, pp. 851-856; published online Mar. 4, 2010 at www.small-journal.com.

Mona M. Hella, "Advanced Light Sensors for Smart Lighting Applications"; Smart Lighting Engineering Research Center, ECSE Department, Rensselaer Polytechnic Institute; created Feb. 11, 2011.

* cited by examiner

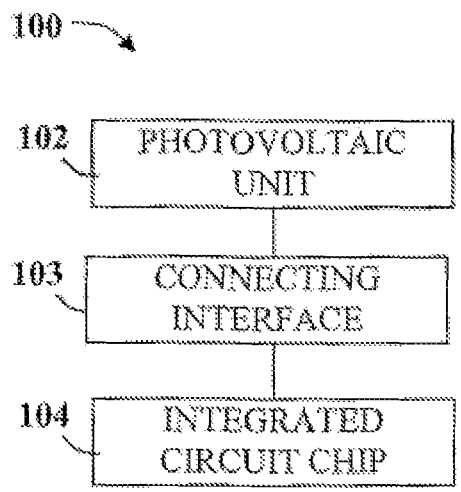
PRIOR ART
Fig. 1
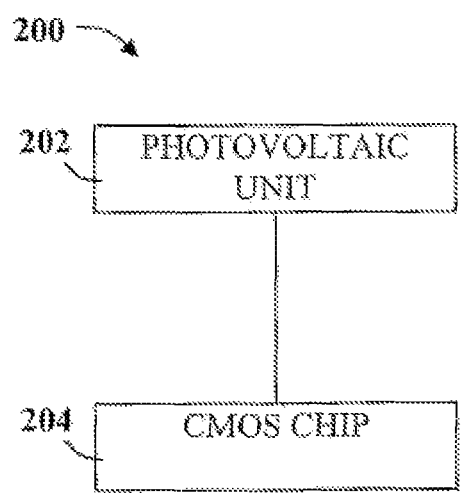 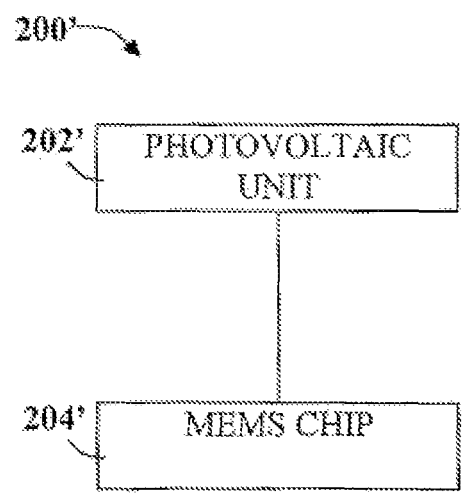
Fig. 2a  Fig. 2b

INTEGRATED CIRCUIT COMBINATION OF A TARGET INTEGRATED CIRCUIT, PHOTOVOLTAIC CELLS AND LIGHT SENSITIVE DIODES CONNECTED TO ENABLE A SELF-SUFFICIENT LIGHT DETECTOR DEVICE

CROSS REFERENCE TO RELATED APPLICATIONS

This application claims priority from U.S. provisional patent application 61/787,017, filed on Mar. 15, 2013. This application is also a continuation-in-part of U.S. patent application Ser. No. 13/270,869 filed on Oct. 11, 2011, which claims priority from U.S. provisional patent application 61/391,905 filed on Oct. 11, 2010, and is a continuation-in-part of U.S. patent application Ser. No. 13/053,610 filed on Mar. 22, 2011, which is a continuation of PCT application No. PCT/IL2009/000930, entitled "Integrated Solar Powered Device" filed Sep. 29, 2009, which claims priority from U.S. provisional patent application No. 61/100,770, filed Sep. 29, 2008. All the above-referenced applications are assigned to common assignee and hereby incorporated by reference for all that they contain.

TECHNICAL FIELD

The invention generally relates to integrated circuit (IC) chips, more particularly to adding a plurality of cell structures over a target integrated circuit (TIC) and more particularly to a plurality of photovoltaic cells for providing energy to a TIC and light sensitive diodes.

BACKGROUND

Integration circuits (ICs), chips or semiconductor devices designed using, for example, a very-large-scale integration (VLSI) process, typically draw power from external sources such as grid power (mains), batteries, or the like. Increasingly however, devices utilizing such components demand greater levels of energy efficiency. This is largely due to the prevalence of wireless and mobile devices with progressively more features becoming more widespread.

Personal communication devices, such as mobile phones, PDAs, handheld PCs, and the like, as well as many entertainment devices, such as media players, MP3, MP4, mobile DVD, digital cameras, and the like, as well as other household, office and leisure gadgets, wireless sensors, machine-to-machine (M2M) communication devices and Internet of Things (IoT) devices are commonly powered by batteries of electrochemical power cells. A drawback with such battery-operated devices is that electrochemical power cells often run out of power. Thus, batteries need to be regularly recharged or replaced.

Such devices may be less dependent upon power provided by electrochemical power cells if some of their components are able to power themselves. Thus, the energy efficiency of mobile devices may be improved by a convenient and effective solar powered VLSI chip.

Furthermore, such solar powered components could be effectively used in applications where a power supply is unavailable. Self-powering components may therefore be utilized in a variety of stand-alone communication units, i.e., road signs for remote locations, and in buoys, floats, or other maritime applications.

Although attempts have been made to connect VLSI chips to elements, such as photovoltaic cells (PVs) in order that they might draw solar power therefrom, the chips and photovoltaic cells are generally manufactured separately and later connected together using external wiring, gates, contacts or terminals.

For example, U.S. Pat. No. 6,680,468 to Wang, entitled, "Electrical-supply-free MOS integrated circuit", describes an electrical-supply-free MOS integrated circuit that includes a semiconductor device having a current terminal, an input voltage terminal, and a common terminal. The voltage difference between the input voltage terminal and the common terminal, controls current flow through the current terminal. An opto-electronic device is also provided to convert incident light into an electrical signal. In another example, PCT Application Publication No. WO/2003/079438 to Jaussaud et al. entitled, "Multi-junction Photovoltaic Device with Shadow-free Independent Cells and the Production Method Thereof", describes a multi-junction photovoltaic device with independent cells. Contact pick-ups are provided on the front and/or rear face of the cells by means of metal wells, the sides of which are insulated from the semi-conducting layers.

Furthermore, US Patent Application Publication No. 2002/0170591 to Armer et al., entitled "Method and apparatus for powering circuitry with on-chip solar cells within a common substrate", describes a light-powered transponder. In order to create sufficient voltage differential, two photovoltaic elements are used. The photovoltaic elements generate voltages of different polarities. Despite the inherent difficulties presented by the use of a standard Complementary metal-oxide-semiconductor (CMOS) process, Aimer's system is directed towards achieving a voltage differential sufficient to power an ASIC by using photovoltaic elements independently to generate voltages with different polarities. As mentioned, all the above-described solutions require separate interconnecting conductors between their integrated circuits and their power sources. However, any additional components compromise the dimensions of the host devices and may provide additional sources of failure. The discussed-above publications are merely provided as a reference for their useful background descriptions of the state of the art heretofore.

FIG. 1 shows a schematic block diagram representing a solar powered integrated circuit 100. It is noted that, in order to use solar energy, devices are typically designed to include three separate components: an integrated circuit 104; a photovoltaic cell 102; and a connecting interface 103.

The integrated circuit 104 may be a miniaturized electronic circuit typically including semiconductor devices as well as passive components. ICs are generally manufactured upon the surface of a thin substrate of semiconductor material. Variously, integrated circuits 104 may be based upon complementary metal-oxide-semiconductor (CMOS) chips, micro-electro-mechanical systems (MEMS) chips, a very large scale integration (VLSI), or the like.

The photovoltaic cell 102 is configured to convert light into electricity typically using the photovoltaic effect. As the photovoltaic cell 102 is typically manufactured separately from the IC, it is necessary to provide the connecting interface 103.

The connecting interface 103 provides a conductive pathway, such as external wiring, gates, contacts, terminals, and the like, between the photovoltaic cell 102 and the integrated circuit 104. In addition, the connecting interface may further provide an intermediate external source layer of a power supply, such as an electrochemical cell, a capacitor or the like.

SUMMARY

Certain embodiments disclosed herein include an integrated circuit (IC). The IC comprises a plurality of photovoltaic (PV) cells formed over a passivation layer of a target integrated circuit (TIC), wherein at least one PV cell of the plurality of PV cells is usable as a light sensing device; an interface to an energy storage unit; the TIC comprising at least: a control unit; and a switching circuit, the switching circuit coupled to the plurality of PV cells, the energy storage, and the control unit; wherein the control unit is configured to control at least the switching circuit to configure a connection scheme, wherein the connection scheme devises at least one first PV cell of the plurality of PV cells to connect to the energy storage and at least one second PV cell to connect to the control unit for light detection.

BRIEF DESCRIPTION OF THE DRAWINGS

The subject matter that disclosed herein is particularly pointed out and distinctly claimed in the claims at the conclusion of the specification. The foregoing and other objects, features, and advantages of the invention will be apparent from the following detailed description taken in conjunction with the accompanying drawings.

FIG. 1 is a schematic block diagram representing a solar powered integrated circuit;

FIGS. 2A and 2B are schematic block diagrams representing two ASIC units according to exemplary embodiments of the integrated solar powered device;

DETAILED DESCRIPTION

Figure 3:
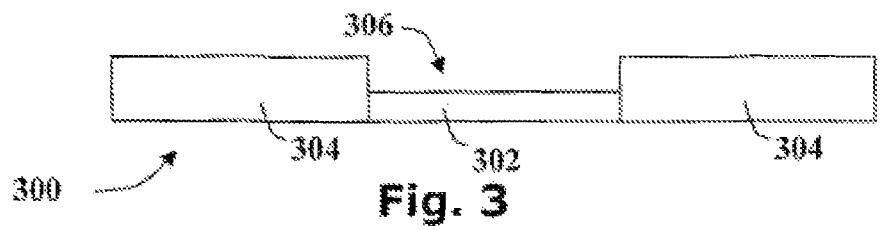
FIGS. 3 to 7 are schematic cross sections showing the stages of fabrication of an exemplary embodiment of the ASIC.

The embodiments disclosed herein are only examples of the many possible advantageous uses and implementations of the innovative teachings presented herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

Certain exemplary embodiments disclosed herein can be utilized in a target integrated circuit (TIC) having a top conductive layer (TCL) that may be connected to a plurality of cells that are further integrated over the TIC. Each of the plurality of cells comprises two conductive layers, a lower conductive layer (LCL) below the cell and an upper conductive layer (UCL) above the cell. Both conductive layers may connect to the TCL of the TIC to form a super IC structure combined of the TIC and the plurality of cells connected thereto. Accordingly, conductivity between the TIC as well as auxiliary circuitry to the TIC may be achieved.

The embodiments disclosed herein can also be utilized in cell structures that combine a TIC and a power cell comprising at least one PV cell and processing thereof that are discussed herein below. The process of manufacturing the integrated circuit (IC) may be any micro-electro-mechanical systems (MEMS) process, standard complementary metal-oxide semiconductor (CMOS) processes, very large scale integration (VLSI), and the like.

FIGS. 2A and 2B schematically show block diagrams representing two embodiments of solar-powered application specific integrated circuit (ASIC) units. With particular reference to FIG. 2A, one embodiment of the solar powered ASIC 200 may include a photovoltaic cell 202 and a CMOS-type chip 204. In FIG. 2B, another embodiment of the solar powered ASIC 200' is shown including the photovoltaic cell 202' and a MEMS-type chip 204'. It should be appreciated by one skilled in the art that embodiments of the solar powered ASIC disclosed herein do not require connecting interfaces, such as the interfaces 103 shown in FIG. 1. It should be further appreciated that reducing the number of separate components is important in technologies, such as integrated circuits, where space saving is an important factor.

Self-powering ASIC units, such as embodiments of the solar powered ASICs 200 and 200' may be enabled by fabricating an integrated circuit upon p-type wafers, for example. P-type or n-type wafers are commonly used as substrate materials for both photovoltaic cells and semiconductor devices. Thus, a common p-type or n-type wafer substrate may be shared by the photovoltaic cell 202, 202' and the chip 204, 204', by designing a photovoltaic structure next to the area on a chip occupied by the circuitry of an IC, thus utilizing the substrate in the traditional "mono cell" way. In another embodiment, it is also possible to stack the photovoltaic structure on top of (rather than to the side of) the integrated circuit (TIC), where the photovoltaic structure and TIC are appropriately separated by a passivation layer so that they function without interfering, thereby reducing the total area requirements and fabrication cost. According to some embodiments, a photovoltaic cell layer may be fabricated over a VLSI device, or alternatively a photovoltaic cell may be fabricated onto one side of the substrate with the VLSI fabricated upon the reverse side. Various photovoltaic fabrication techniques may be used, including thin-film manufacturing, and the like.

Thus, the photovoltaic cell 202, 202' and chip circuit 204, 204' may be manufactured in one process or as one piece with no additional connecting interface external to the semiconductor chip. Hence, the solar-powered ASIC may be manufactured in one process, according to electrical and other rules for integration of the layers.

Possible methods for the fabrication of embodiments of self-powering ASIC units are described below with reference to FIGS. 3 to 8. Specifically, FIGS. 3 to 7 show schematic cross sections representing the main elements of the ASIC unit during various stages of its fabrication. FIG. 8 is a flowchart showing the steps of a general method of manufacture.

FIG. 3 is a schematic cross section showing the main elements of an integrated circuit base wafer 300. The base wafer 300 may be prepared, for example, using a standard CMOS process. In particular, the integrated circuit base wafer 300 includes metal pads 302 and a passivation layer 304.

The passivation layer 304 partially covers the metal pads 302. However, the passivation layer 304 is interrupted by openings 306 which provide channels through which an electrical connection may be formed between the metal pads 302 and overlying layers or other components.

Figure 4:
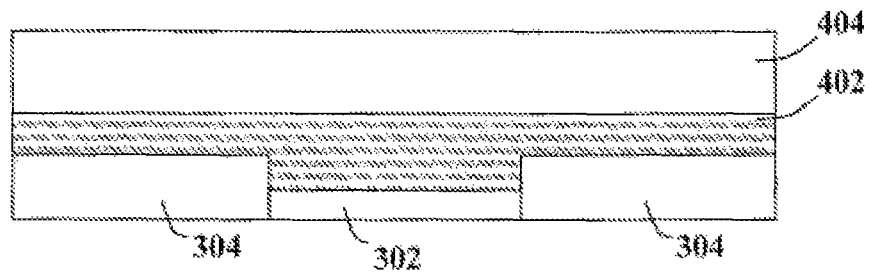

FIG. 4 is a schematic cross section showing the base wafer 300 of FIG. 3 over which photovoltaic enabling layers have been deposited. Two photovoltaic enabling layers are represented, a lower photovoltaic metal electrode layer 402 and a photovoltaic stack 404. Various materials, well known in the art, may be used as photovoltaic stacks 404 of embodiments of the solar powered ASIC. For example, thin film photovoltaic stacks may use hydrogenated amorphous silicon (a-Si.H), microcrystaline silicon (μ-Si:H) photo cells, cadmium telluride (CdTe), copper indium gallium selenide (CIGS) or the like. Typically, the top conducting material is transparent and the actual metal on the solar cells covers a small portion of the surface.

The lower photovoltaic metal electrode layer 402 provides conductive communication between the photovoltaic stack 404 and the metal pads 302 exposed by openings in the passivation layer 304. Typically, the lower photovoltaic metal electrode layer 402 is a metal deposition layer such as aluminum, although any conducting layer may be used to suit requirements.

Figure 5:
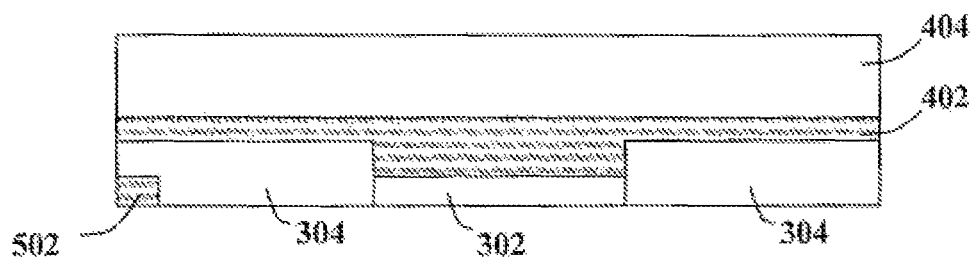

In FIG. 5, the cross section of the wafer of FIG. 4 is shown with an additional opening 502 exposing the metal pad 302 of the base wafer 300. The opening 502 may be used to provide a conductive channel connecting the metal pad 302 to the upper electrode 702 (FIG. 7) of the photovoltaic cell 404. Typically, the opening 502 may be created using an etching process in which the photovoltaic stack 404 is etched to re-expose the metal pads 302; it is also possible to expose new pads for connecting to the photovoltaic cell.

Figure 6:
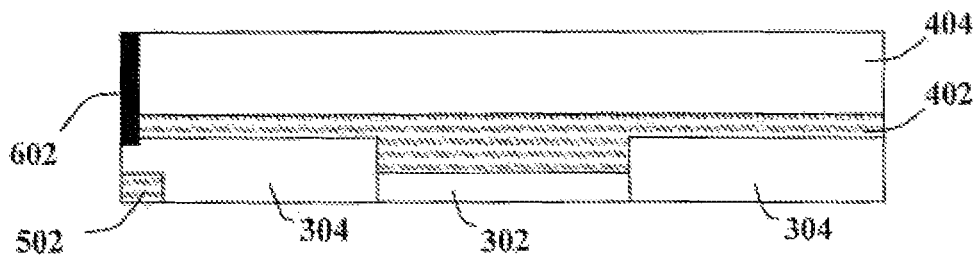

FIG. 6 shows a cross sectional view of the wafer of FIG. 5 including a separator 602. The separator 602 provides a film that isolates the top electrode 702 (FIG. 7) and bottom electrodes 402 of the photovoltaic stack 404. The separator 602 may be formed by deposition of an isolating film such as silicon dioxide ($SiO_2$), over the wafer, which may then be selectively etched back to re-expose. Typically, following the etching back process, spacers are located along the walls of the photovoltaic cell 404.

Figure 7:
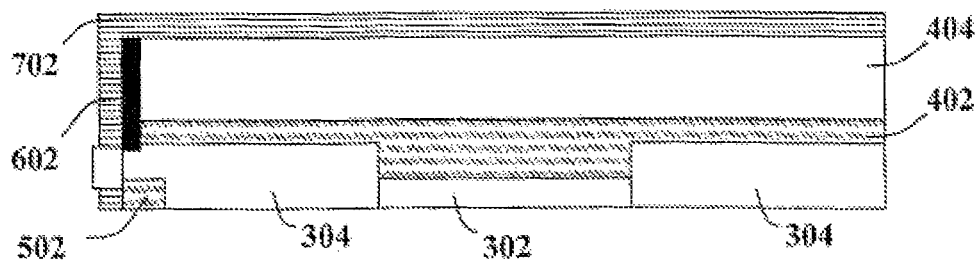
Figure 8:
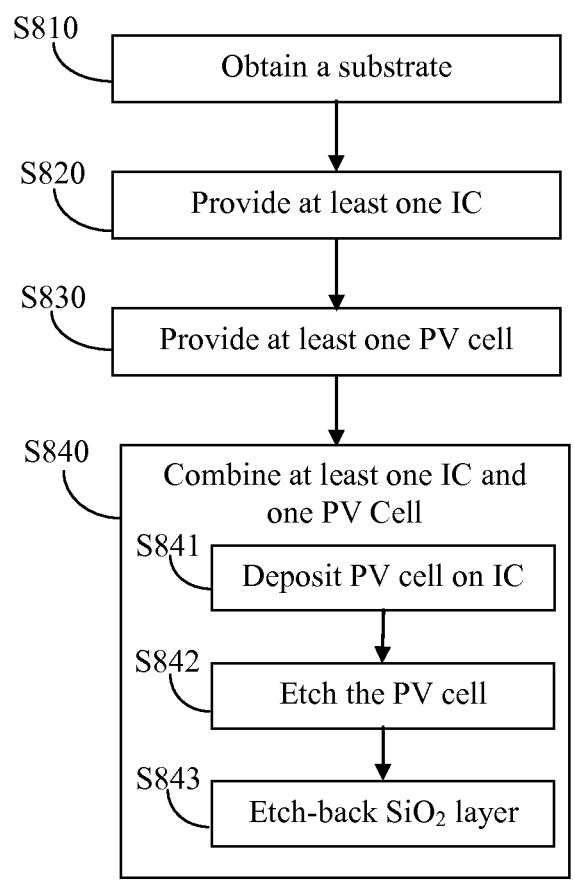
FIG. 8 is a flowchart illustrating a method for producing a self-powering ASIC.

FIG. 7 shows a schematic cross section of the main elements of an embodiment of the solar powered ASIC following fabrication. A top electrode 702 has been provided for the photovoltaic stack 404. The top electrode 702 may be provided, for example, by depositing an aluminum layer over the photovoltaic stack 404 and in conductive communication with the base wafer via the opening 502 created during the etching process.

It is noted that the lower electrode 402 and the top electrode 702 may be prepared by the CMOS process that is used for the VLSI part of the integrated device, therefore may vary from one process to the other.

It should be appreciated that the embodiment described above in relation to FIGS. 3 to 7 relates to an integrated circuit having an overlaid photovoltaic cell. In alternative embodiments, the integrated circuit and photovoltaic layers may be deposited upon reverse sides of a single substrate. Other configurations should be apparent to one of ordinary skill.

FIG. 8 shows a non-limiting and exemplary flowchart representing a method for producing an essentially self-powering ASIC unit in accordance with an embodiment. The production method comprises obtaining a substrate (S810); providing at least one integrated circuit upon the substrate (S820); providing at least one photovoltaic cell upon the substrate (S830); and combining the at least one integrated circuit and at least one photovoltaic cell (S840).

In S810 a substrate is obtained. Integrated circuits may be manufactured in the surface of a thin substrate, optionally made of semiconductor material. In S820 at least one integrated circuit may be provided upon the substrate. The integrated circuit may be CMOS, MEMS or other circuits. In S830, at least one photovoltaic cell may be provided upon the substrate. A layer that comprises at least one photovoltaic cell may be added to the integrated circuit in order to produce the integrated ASIC.

In S840, the integrated circuit and the photovoltaic cell may be combined. In an embodiment of the invention, combining the integrated circuit and the photovoltaic cell into an integrated ASIC S840 may include depositing the at least one photovoltaic cell on the integrated circuit (S841); etching the at least one photovoltaic cell (S842); and etching back a silicon dioxide layer (S843).

In S841, the photovoltaic cell is deposited. On top of the integrated circuit, a Photovoltaic Metal Electrode (BPVE) layer is deposited and on top of BPVE layer a thin film photovoltaic stack is placed.

In S842 the photovoltaic cell is etched. Strong acid or mordant is used to cut into the unprotected parts of a metal surface to create a design in the metal. The etching creates openings that re-expose parts of the integrated circuit and open new pads that are later to be connected to the top electrode of the photovoltaic cell.

In S843 a silicon dioxide layer is etched back. A silicon dioxide layer is deposited over the ASIC unit and then etched back, providing an isolating film between the top and bottom photovoltaic electrodes.

Figure 9:
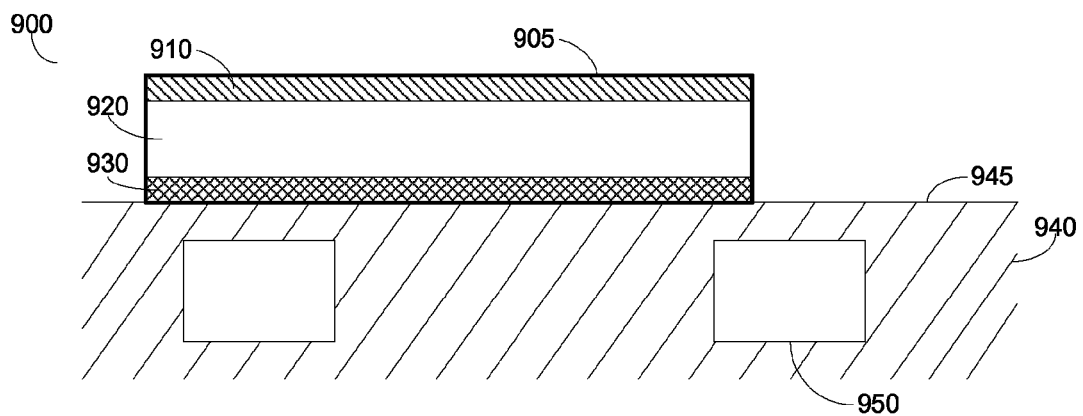
FIG. 9 is a schematic cross-section of a target integrated circuit (TIC) upon which a cell is integrated.

FIG. 9 shows an exemplary and non-limiting schematic cross-section 900 of a TIC 940 on which a cell 905 is integrated in accordance with an embodiment of the invention. The cell 905 is comprised of the cell device 920, for example, but without limitation, a photovoltaic (PV) cell discussed hereinabove, each such cell having a LCL 930 below the cell device 920 and further having a UCL 910 above the cell device 920. The cell 905 is integrated over the surface 945 of the TIC 940, which may be, without limitation, any kind of semiconductor devices that have a particular function. The TIC 940 further comprises a TCL 950 that is used to electrically connect the cell 905 to the electrical routing of the TIC 940, and is as further described herein below.

Figure 10:
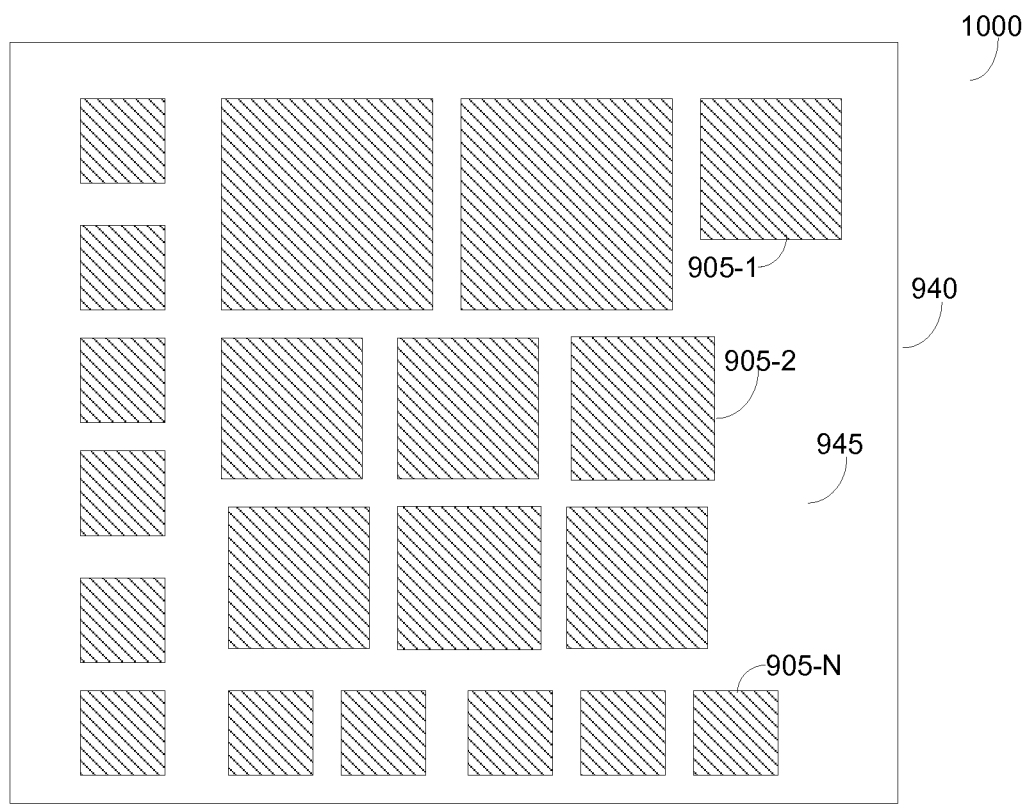
FIG. 10 is a top view of the target integrated circuit with a plurality of cells added onto the top surface of the target integrated circuit.

FIG. 10 shows an exemplary and non-limiting top view of a TIC 940 with a plurality of cells 905 added on the top surface 945 of the TIC 940. The plurality of cells 905-1 through 905-N may be the same kind of a cell. However, as also shown in FIG. 10, different cells 905 may be used, i.e., cell 905-1 may be different from cell 905-N. Accordingly different cells 905 may be used, each having different sizes and/or different shapes. The cells 905 may cover the entire TIC 940 or portions thereof, and all are mounted over the surface 945 of the TIC 940. Each of the cells 905 has an UCL and a LCL.

Figure 11:
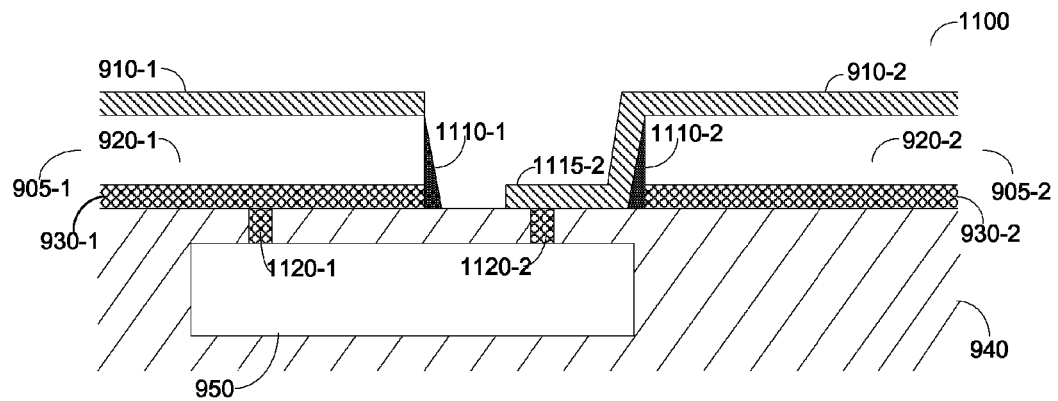
FIG. 11 is a schematic cross-section of two cells connected to the target integrated circuit.

FIG. 11 shows an exemplary and non-limiting schematic cross-section 1100 of two cells 905 connected to the TIC 940. The two cells 905-1 and 905-2 are integrated over the TIC 940. The TIC 940 further comprises a TCL 950 to which through a connector 1120-1 an electrical connection is made between the TCL 950 to the LCL 930-1 of cell 905-1. In addition, a connector 1120-2 also connected to the TCL 950 through a conductive path 1115-2 which is further connected to UCL 910-2. Hence, an electrical connection is now formed from cell 905-1 through LCL 930-1, connector 1120-1, TCL 950, connector 1120-2, conductive path 1115-2 and UCL 910-2. An isolation spacer 1110-2 is used to ensure that the conducting path 1115-2 does not make unwanted connection to the cell device 920-2. The isolation spacer 1110-1 avoids unwanted connection to the LCL 930-1 of cell 905-1. The exemplary connection should not be understood as limiting upon the invention and other connection options are possible that are consistent with the disclosed embodiments.

Figure 12:
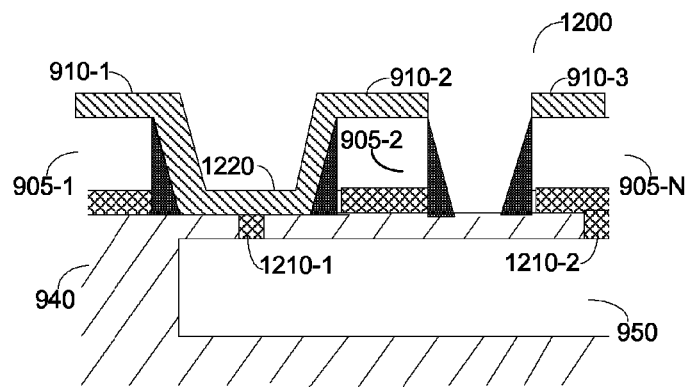
FIG. 12 is a schematic cross-section of three cells connected to the target integrated circuit.

FIG. 12 shows an exemplary and non-limiting schematic cross-section 1200 of three cells 905-1, 905-2, and 905-3 connected to the target integrated circuit 940. From the UCL 910-1 and 910-2 a conducting path leads to a connector 1210-1 that connects both UCL 910-1 and 910-2 via the conductive path 1220 and the connector 1210-1 to the TCL 950 of TIC 940. The third cell 905-3 is connected to the TCL 950 of TIC 940 by means of connector 1210-2 that provides electrical connectivity to the LCL of cell 905-3. Thereby connectivity is achieved from the UCL of both cells 905-1 and 905-2 to the LCL of cell 905-3. The TCL 950 is the patterned conducting layer within the TIC 940 which connects the photovoltaic cells 905-1 through 905-N, to a switching circuit (such as switching circuit 1520 in FIG. 15).

Figure 13:
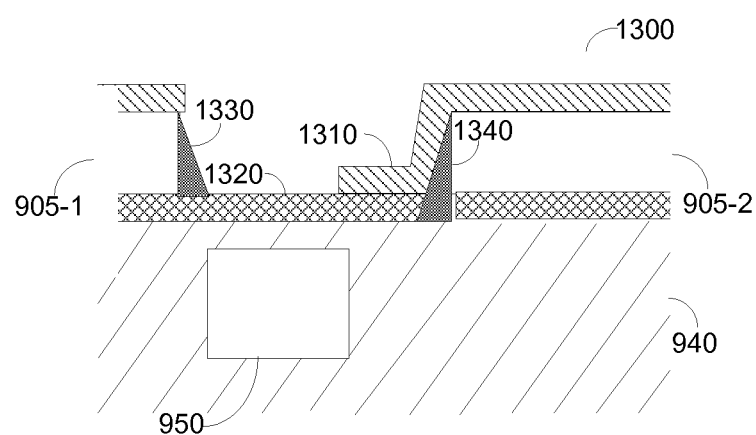
FIG. 13 is a schematic cross-section of two cells connected to each other from a lower conducting layer of a first cell to an upper conducting layer of a second cell.

The cross-section 1300 shown in FIG. 13 depicts two cells 905-1 and 905-2 connected to each other from the LCL of the first cell 905-1 to the UCL of the second cell 905-2. According to this embodiment, the LCL of the first cell 905-1 is extended beyond the cell 905-1 to form a conductive path 1320. The conductive path 1320 is connected to a conductive path 1310 that is further connected to the UCL of cell 905-2. According to this embodiment, a connection between the LCL of cell 905-1 and the UCL of cell 905-2 is achieved without a connection through the TCL 950 of the TIC 940. The isolation spacer 1330 is designed to allow the extension of the LCL of cell 905-1 to the conducting path 1310. The isolation spacer 1340 ensures that no conducting path is created between the conductive path 1310 and the LCL of cell 905-2. It should be noted that by using this geometry of deposited and etched features, it is possible to connect photovoltaic cells in series, thus adding their respective voltages, which is typical of the design of larger-scale solar panels.

Figure 14:
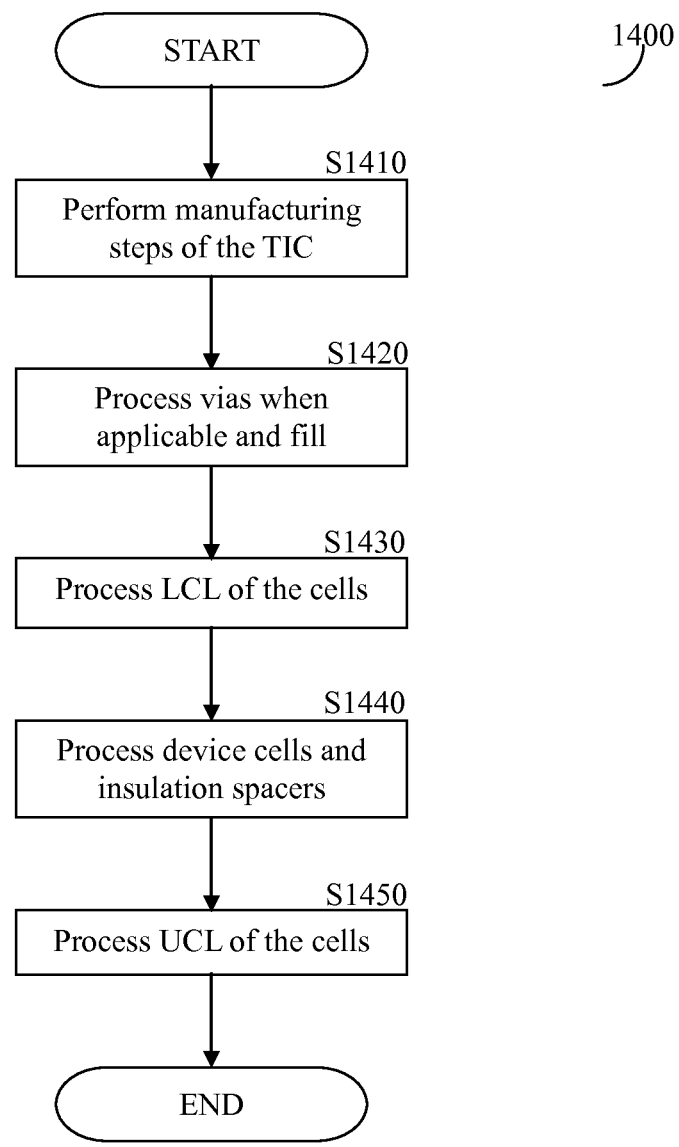
FIG. 14 is a flowchart describing a manufacturing method of an integrated circuit combined with a target integrated circuit.

FIG. 14 shows a non-limiting and exemplary manufacturing method of an integrated circuit combined with a TIC. In S1410, a manufacturing process of the TIC is performed. This manufacturing process may be any fabrication technique known in the related art. The manufactured TIC depends on the specific manufacturing process used, the type of conductive layers, and so on. In S1420, if applicable, vias are created in the TIC to allow for the connectors, such as connector 1120, to be formed by filling them with a conducting material such as an appropriate metal. In S1430, the LCL of the cells 905 is formed. In S1440, the cells and when applicable insulating spacers are formed as may be appropriate. In S1450 the UCL is manufactured to complete the manufacturing of the cells 905 and connections thereto.

Figure 15:
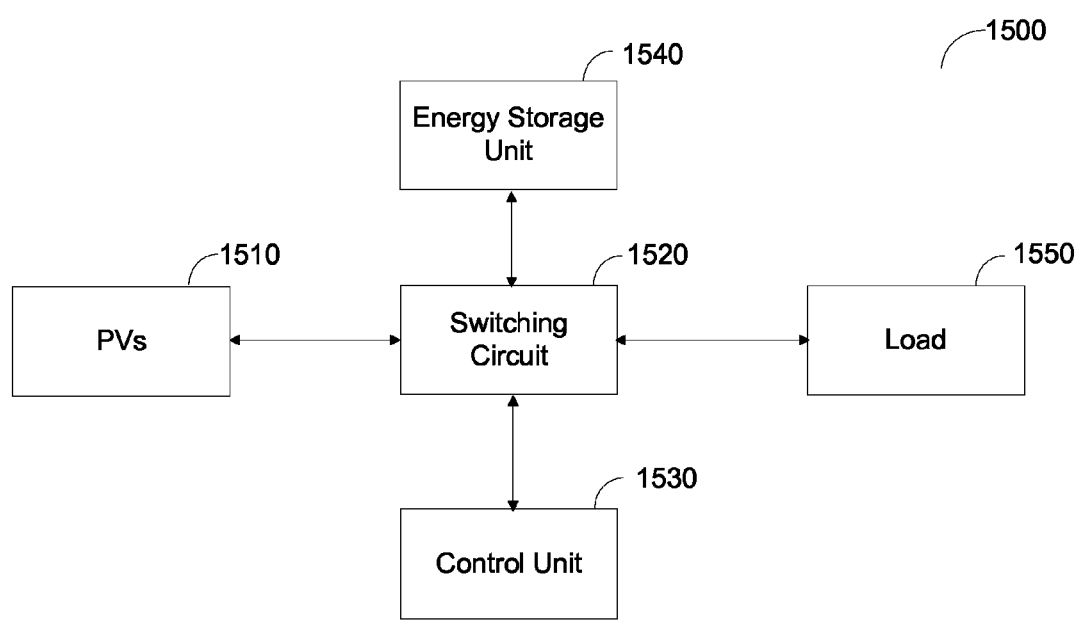
FIG. 15 is a schematic diagram of a circuit including a plurality of photovoltaic cells according to one embodiment.

FIG. 15 is a non-limiting and exemplary schematic of an integrated circuit 1500 including a plurality of PV cells generally referenced as PV cells 1510, according to one embodiment. The plurality of PV cells 1510 are coupled to a switching circuit 1520. The switching circuit 1520 is further coupled to a control unit 1530, an energy storage unit 1540, and to at least one load 1550, such as a circuitry of a TIC, or any other current consuming on-chip or off-chip load. The switching circuit 1520 is adapted to switch each PV cell or group of PV cells of the plurality of PVs 1510 between the energy storage unit 1540, the load 1550, and the control unit 1530.

The control unit 1530 may be realized as a logic circuitry, a processing unit, the like and combinations thereof. The control unit 1530 may include or be coupled to a memory that contains instructions for the operation of the control unit 1530. The energy storage unit 1540 may be a rechargeable battery, a capacitor, and the like. In one embodiment, the IC 1500 may be packaged in a transparent material package, such as a glass or quartz.

According to one embodiment, under the control of control unit 1530, a first group of PV cells containing one or more PV cells of the plurality of PV cells 1510 may be switched to feed energy storage unit 1540, while a second group of PV cells containing one or more other PV cells of the plurality of PV cells 1510 may be switched to connect to the control unit 1530. The control unit 1530 is configured to sense the amount of current flowing through the second group of PV cells, operative in this embodiment as light sensing devices.

The light sensed by the device 1500 may be used to control the TIC. In an embodiment, the TIC includes a transmitter which wirelessly transmits the level of light sensed by the device 1500. Therefore, the device 1500 is an autonomous device that is configured to provide for its own power needs. The plurality of PV cells 1510 may include one or more PV cells susceptible to a different light wavelength than at least another PV cell. In another embodiment, by comparing the current flowing in a first group of PV cells susceptible to a first wavelength to the current flowing in a second group of PV cells susceptible to a second wavelength, it is possible to determine the intensity of a given wavelength of light or to determine the luminous environment in which the circuit is present. It will be appreciated by one skilled in the art that the plurality of PV cells 1510 may include PV cells susceptible to a third wavelength, fourth wavelength, and so on without departing from the scope of the disclosure.

Figure 16:
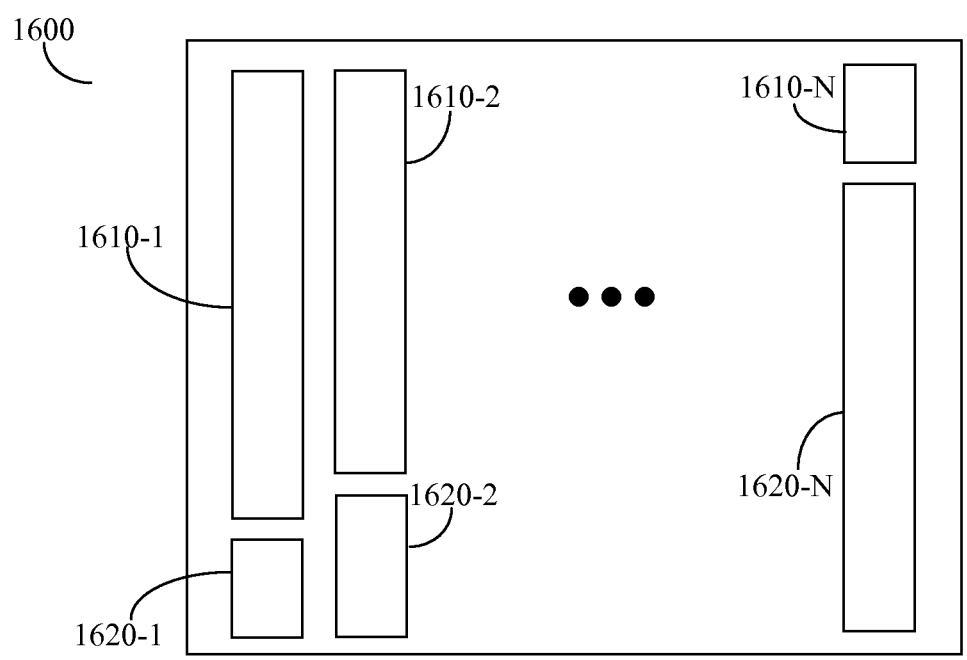
FIG. 16 is a top view of an array of a plurality of photovoltaic cells operative as energy collectors or light sensing devices formed over a target integrated circuit according to one embodiment.

FIG. 16 is an exemplary and non-limiting top view of an array 1600 of a plurality of photovoltaic (PV) cells operative as energy collectors or light sensing devices formed over a target integrated circuit (TIC) according to one embodiment. According to this embodiment, a plurality of primary PV cells 1610-1, 1610-2 through 1610-N have a decreasing size, relative to each other, and a plurality of secondary PV cells 1620-1, 1620-N through 1620-N have an increasing size relative to each other, where, N is an integer greater than 1. The plurality of primary PV cells 1610 and the plurality of secondary PV cells 1620 are arranged in an array structure, such that the combined length of a primary PV cell 1610 with length of a corresponding secondary PV cell 1620 is a constant length. For example, the combined length of the primary PV cell 1610-1 with the length of secondary PV cell 1620-1 is equal to the combined length of the primary PV cell 1610-N with length of the secondary PV cell 1620-N. Such a structure allows the switching circuit 1520 (FIG. 15), controlled by the control unit 1530, to connect the PV cells 1610-1, 1610-N and 1620-1, 1620-N in various configurations. The PV cells 1610-1, 1610-N and 1620-1, 1620-N may or may not be of different sizes. In one embodiment, the plurality of PV cells in the array 160 are arranged in such way that the pairs of a primary PV cell (e.g., cell 1610-1) and a secondary PV cell (e.g., cell 1610-2) have the same width, but the combined length of such cells is a constant length.

For example, but not by way of limitation, when it is determined that light conditions are such that it is sufficient to detect light by a single PV cell, then all PV cells but PV cell 1610-N are switched to charge the energy storage 1540. As the light sensing PV cell 1610-N senses less light, and therefore potentially becomes less sensitive, a PV cell 1620-1 may be also switched to a light sensing configuration. As less and less light is available, more and more PV cells 1610 and 1620 are switched to a light sensing configuration, thereby increasing overall light collection sensitivity. As a result, the array 1600 is further configured to dynamically set its sensitivity for light sensing as well as for energy collection as the amount of light is provided thereon.

In one embodiment, PV cells that may be used as light sensing devices are designed to have different characteristics that go beyond their physical dimensions. For example, and without limitations, a PV cell may be sensitive to wave lengths corresponding to red light, but not to wave lengths corresponding to blue light. It should be noted that the light sensing PV cell may be sensitive to a wavelength range.

In yet another embodiment, at least one of the light sensing devices is not connected to the switching circuit 1520 and is available for use by an external device. In yet another embodiment, the control unit 1530, may be further connected to receive its power by appropriate switching of the switching circuitry 1520, that is, the control unit 1530 may be connected to the load 1550 for the purpose of being powered such that the TIC power requirements defined by minimum and maximum DC voltage specification, and dynamic current requirements, are met. The PV cells may differ from one another with respect of their physical characteristics, which include, but are not limited to, length, width, shape, and sensitivity. The sensitivity may be sensitivity to light wavelengths and/or light energy.

The embodiments disclosed herein are only examples of the many possible advantageous uses and implementations of the innovative teachings presented herein. Particularly, it should be noted that while specific examples were provided with respect of PV cells the scope of the invention should not be viewed as limited to such PV cells. Other cells having the general structure discussed at least with respect of FIG. 9 are specifically included. Moreover, the invention is not restricted for use in CMOS, MEMS and Silicon technologies and may be equally implemented in other technologies such as, but not limited to, Gallium arsenide (GaAs), and silicon-germanium (SiGe) technologies. The devices may also include devices, such as junction gate field-effect transistor (JFET), metal semiconductor field effect transistor (MESFET), BiPolar, and others and any combinations thereof. In general, statements made in the specification of the present application do not necessarily limit any of the various claimed inventions.

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention. Furthermore, the foregoing detailed description has set forth a few of the many forms that the invention can take. It is intended that the foregoing detailed description be understood as an illustration of selected forms that the invention can take and not as a limitation to the definition of the invention.

What is claimed is:

1. An integrated circuit (IC), comprising:
   a plurality of photovoltaic (PV) cells formed over a passivation layer of a target integrated circuit (TIC); and
   an interface adapted to be coupled to an energy storage unit;
   the TIC comprising at least:
      a control unit; and
      a switching circuit, the switching circuit being coupled to at least one of the plurality of PV cells, the interface to the energy storage unit, and the control unit;
   wherein the control unit, when operating, is configured to control at least the switching circuit to couple at least one first PV cell of the plurality of PV cells to the energy storage unit, wherein energy generated by the at least one first PV cell of the plurality of PV cells is stored in the energy storage unit, and to couple at least one second PV cell of the plurality of PV cells to the control unit, wherein the control unit is configured to employ energy generated by the at least one second PV cell of the plurality of PV cells for determining a characteristic of light incident on the at least one second PV cell of the plurality of PV cells.

2. The IC of claim 1, wherein at least two PV cells of the plurality of PV cells differ from each other in at least one of their physical characteristics.

3. The IC of claim 2, wherein the physical characteristics are at least one of: width, length, shape, and sensitivity.

4. The IC of claim 3, wherein the sensitivity is sensitivity to at least one of: light wavelength and light energy.

5. The IC of claim 1, wherein ones of the plurality of PV cells are logically arranged into two or more grouped pairs, where each of the pairs includes one of the plurality of PV cells which is designated as a primary PV cell for the pair and each of the pairs includes one of the plurality of PV cells which is designated as a secondary PV cell for the pair, wherein all of the PV cells arranged in the grouped pairs are of the same type, have the same width, and wherein for each pair the combined length of the primary PV cell and the length of the secondary PV cell is the same.

6. The IC of claim 1, wherein the at least one second PV cell generates energy as a function of one of: a specific wavelength and a range of wavelengths.

7. The IC of claim 1, wherein the TIC further comprises:
   a circuit for wireless transmission of information respective of the energy generated by the at least one second PV cell of the plurality of PV cells.

8. The IC of claim 1, wherein information respective of the energy generated by the at least one second PV cell of the plurality of PV cells is made available for use external to the IC.

9. The IC of claim 1, wherein the control unit comprises at least one of: a logic circuitry and a processing unit.

10. The IC of claim 1, wherein the energy storage unit is at least one of: a capacitor and a rechargeable battery.

11. The IC of claim 1, wherein ones of the plurality of PV cells are logically arranged into two or more grouped pairs, where each of the pairs includes one of the plurality of PV cells which is designated as a primary PV cell for the pair and each of the pairs includes one of the plurality of PV cells which is designated as a secondary PV cell for the pair, wherein all of the PV cells arranged in the grouped pairs are of the same type, have the same width, and wherein for each pair (i) the combined length of the primary PV cell and the length of the secondary PV cell is the same while (ii) each respective length of the primary PV cell and the secondary PV cell are different.

* * * * *